(12) United States Patent
Chuang et al.

(10) Patent No.: US 11,683,990 B2
(45) Date of Patent: Jun. 20, 2023

(54) TECHNIQUES FOR MRAM MTJ TOP ELECTRODE CONNECTION

(71) Applicant: Taiwan Semiconductor Manufacturing Co., Ltd., Hsin-Chu (TW)

(72) Inventors: Harry-Hak-Lay Chuang, Zhubei (TW); Chern-Yow Hsu, Chu-Bei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 584 days.

(21) Appl. No.: 16/717,115

(22) Filed: Dec. 17, 2019

(65) Prior Publication Data

US 2020/0127191 A1 Apr. 23, 2020

Related U.S. Application Data

(60) Continuation of application No. 15/809,182, filed on Nov. 10, 2017, now Pat. No. 10,535,814, which is a division of application No. 15/000,289, filed on Jan. 19, 2016, now Pat. No. 9,818,935.

(60) Provisional application No. 62/184,653, filed on Jun. 25, 2015.

(51) Int. Cl.
| | |
|---|---|
| H01L 43/08 | (2006.01) |
| H10N 50/10 | (2023.01) |
| H10N 50/01 | (2023.01) |
| H10B 61/00 | (2023.01) |

(52) U.S. Cl.
CPC ............. *H10N 50/10* (2023.02); *H10N 50/01* (2023.02); *H10B 61/22* (2023.02)

(58) Field of Classification Search
CPC ........ H01L 43/08; H01L 43/12; H01L 27/228
See application file for complete search history.

(56) References Cited

U.S. PATENT DOCUMENTS

| 7,211,849 B2 | 5/2007 | Hineman et al. |
|---|---|---|
| 7,880,249 B2 | 2/2011 | Yuan et al. |
| 8,710,605 B2 | 4/2014 | Takahashi et al. |

(Continued)

OTHER PUBLICATIONS

Non-Final Office Action dated Jan. 23, 2017 for U.S. Appl. No. 15/000,289.

(Continued)

*Primary Examiner* — Trang Q Tran
(74) *Attorney, Agent, or Firm* — Eschweiler & Potashnik, LLC

(57) ABSTRACT

Some embodiments relate to an integrated circuit including a semiconductor substrate and an interconnect structure disposed over the semiconductor substrate. The interconnect structure includes a plurality of dielectric layers and a plurality of metal layers that are stacked over one another in alternating fashion. The plurality of metal layers include a lower metal layer and an upper metal layer disposed over the lower metal layer. A bottom electrode is disposed over and in electrical contact with the lower metal layer. A dielectric layer is disposed over an upper surface of the bottom electrode. A top electrode is disposed over an upper surface of the dielectric layer and is in direct electrical contact with a lower surface of the upper metal layer.

20 Claims, 7 Drawing Sheets

(56) References Cited

U.S. PATENT DOCUMENTS

| | | | |
|---|---|---|---|
| 8,829,580 B2 | 9/2014 | Sugiura et al. | |
| 8,866,242 B2 | 10/2014 | Li et al. | |
| 8,872,149 B1 | 10/2014 | Hsieh et al. | |
| 9,117,924 B2 | 8/2015 | Kitagawa et al. | |
| 9,142,762 B1 | 9/2015 | Li et al. | |
| 9,190,260 B1 | 11/2015 | Zhang et al. | |
| 9,231,193 B2 | 1/2016 | Iwayama et al. | |
| 9,276,195 B2 | 3/2016 | Kanaya et al. | |
| 9,306,152 B2 | 4/2016 | Iwayama et al. | |
| 9,324,937 B1 | 4/2016 | Annunziata et al. | |
| 9,343,659 B1 | 5/2016 | Lu et al. | |
| 9,431,602 B2 | 8/2016 | Nagel et al. | |
| 9,818,935 B2 | 11/2017 | Chuang et al. | |
| 10,062,733 B1 | 8/2018 | Yi et al. | |
| 10,461,245 B2 | 10/2019 | Tsubata et al. | |
| 10,468,591 B2 | 11/2019 | Kamada et al. | |
| 2001/0046737 A1* | 11/2001 | Ahn | H01L 27/10855 257/E21.507 |
| 2004/0205958 A1 | 10/2004 | Grynkewich et al. | |
| 2008/0096290 A1 | 4/2008 | Smith et al. | |
| 2009/0085132 A1 | 4/2009 | Kao et al. | |
| 2009/0130779 A1 | 5/2009 | Li et al. | |
| 2009/0209050 A1 | 8/2009 | Wang et al. | |
| 2010/0193888 A1 | 8/2010 | Gu et al. | |
| 2010/0284103 A1 | 11/2010 | Ibusuki et al. | |
| 2011/0049656 A1 | 3/2011 | Li et al. | |
| 2011/0076784 A1 | 3/2011 | Druist et al. | |
| 2012/0032287 A1 | 2/2012 | Li et al. | |
| 2012/0175707 A1* | 7/2012 | Jung | H01L 21/76814 257/E27.06 |
| 2012/0205764 A1 | 8/2012 | Chen et al. | |
| 2013/0026585 A1* | 1/2013 | Sung | H01L 43/08 257/E29.323 |
| 2013/0032775 A1* | 2/2013 | Satoh | H01L 23/5226 257/1 |
| 2013/0034917 A1 | 2/2013 | Lee | |
| 2013/0062714 A1 | 3/2013 | Zhu et al. | |
| 2013/0337582 A1 | 12/2013 | Satoh et al. | |
| 2014/0210103 A1 | 7/2014 | Satoh et al. | |
| 2015/0061052 A1 | 3/2015 | Huang et al. | |
| 2015/0249204 A1* | 9/2015 | Ha | H01L 27/228 257/421 |
| 2015/0255507 A1 | 9/2015 | Pakala et al. | |
| 2016/0072047 A1 | 3/2016 | Seto et al. | |
| 2016/0155934 A1 | 6/2016 | Hwang et al. | |
| 2016/0225817 A1 | 8/2016 | Machkaoustan et al. | |
| 2016/0268499 A1 | 9/2016 | You et al. | |
| 2016/0268505 A1 | 9/2016 | Sung et al. | |
| 2016/0322421 A1 | 11/2016 | Ito | |
| 2016/0351792 A1 | 12/2016 | Jiang et al. | |
| 2016/0351799 A1 | 12/2016 | Xue et al. | |

OTHER PUBLICATIONS

Notice of Allowance dated Jul. 12, 2017 for U.S. Appl. No. 15/000,289.
Non-Final Office Action dated Oct. 25, 2018 for U.S. Appl. No. 15/809,182.
Final Office Action dated May 23, 2019 for U.S. Appl. No. 15/809,182.
Non-Final Office Action dated Aug. 29, 2019 for U.S. Appl. No. 15/809,182.
Notice of Allowance dated Nov. 15, 2019 for U.S. Appl. No. 15/809,182.

* cited by examiner

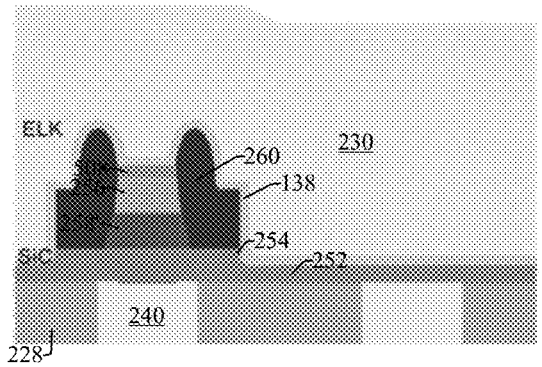
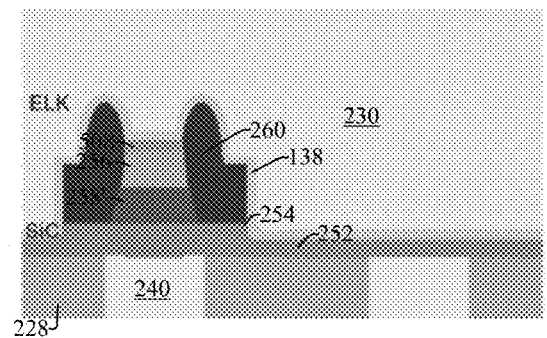
FIG. 9  FIG. 10
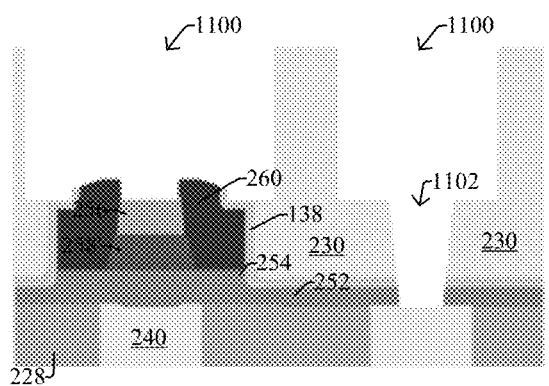
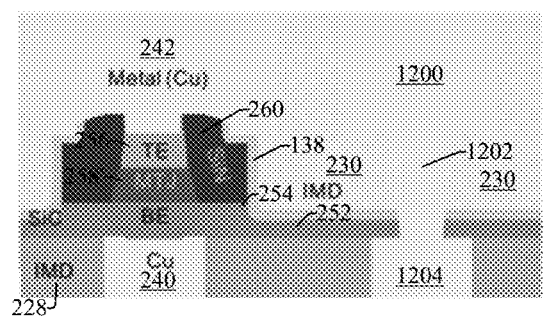
FIG. 11  FIG. 12

TECHNIQUES FOR MRAM MTJ TOP ELECTRODE CONNECTION

REFERENCE TO RELATED APPLICATIONS

This application is a Continuation of U.S. application Ser. No. 15/809,182, filed on Nov. 10, 2017, which is a Divisional of U.S. application Ser. No. 15/000,289, filed on Jan. 19, 2016 (now U.S. Pat. No. 9,818,935, issued on Nov. 14, 2017), which claims the benefit of U.S. Provisional Application No. 62/184,653, filed on Jun. 25, 2015. The contents of the above-referenced patent applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 through 20 illustrate a series of incremental manufacturing steps as a series of cross-sectional views.

DETAILED DESCRIPTION

Figure 1:
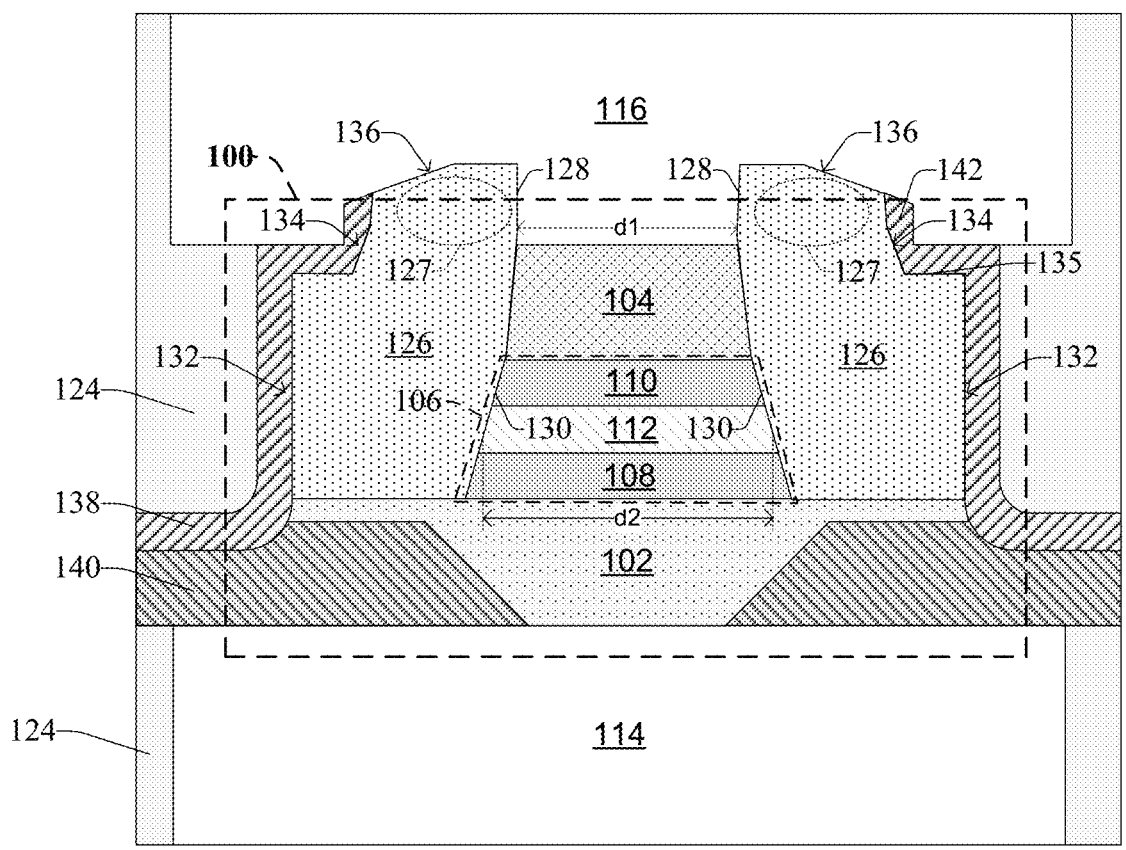
FIG. 1 illustrates a cross-sectional view of some embodiments of an MRAM cell, including a magnetic tunneling junction (MTJ), according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell includes upper and lower electrodes, and a magnetic tunnel junction (MTJ) arranged between the upper and lower electrodes. In conventional MRAM cells, the upper electrode is coupled to an overlying metal layer (e.g., metal 1, metal 2, metal 3, etc.) by a contact or via. Although use of this coupling contact or via is widely adopted, the overall height of this MRAM cell plus this contact or via thereover is large relative to typical vertical spacing between adjacent metal layers (e.g., between a metal 2 layer and a metal 3 layer). To make this height more in line with the vertical spacing between adjacent metal layers, the present disclosure provides for techniques to couple the top electrode directly to an overlying metal line without a via or contact there between.

Referring to FIG. 1, a cross-sectional view of an MRAM cell 100 in accordance with some embodiments is provided. The MRAM cell 100 includes a bottom electrode 102 and a top electrode 104, which are separated from one another by a magnetic tunnel junction (MTJ) 106. The bottom and top electrodes 102, 104 are disposed between a lower metal layer 114 and an upper metal layer 116, and are surrounded by dielectric material such as an interlayer dielectric (ILD) or intermetal dielectric (IMD) layer 124.

The MTJ 106 includes a lower ferromagnetic electrode 108 and an upper ferromagnetic electrode 110, which are separated from one another by a tunneling barrier layer 112. In some embodiments, the lower ferromagnetic electrode 108 can have a fixed or "pinned" magnetic orientation, while the upper ferromagnetic electrode 110 has a variable or "free" magnetic orientation, which can be switched between two or more distinct magnetic polarities that each represents a different data state, such as a different binary state. In other implementations, however, the MTJ 106 can be vertically "flipped", such that the lower ferromagnetic electrode has a "free" magnetic orientation, while the upper ferromagnetic electrode 110 has a "pinned" magnetic orientation.

Notably, rather than a contact or via coupling the top electrode 104 to an overlying metal layer 116, the top electrode 104 itself is in direct electrical contact with the overlying metal layer 116. In some embodiments, the top electrode 104 and overlying metal layer 116 meet at a planar interface 122 that extends between neighboring MRAM sidewall spacers 126. Because there is no via or contact between the top electrode 104 and the overlying metal layer 116, the overall height of the MRAM cell 100 is more easily compatible with back-end-of-line (BEOL) process flows.

In some embodiments, MRAM sidewalls spacers 126 have upper portions 127, which protrude upward beyond an upper surface of the top electrode 104 and into a recess in a lower surface region of the upper metal layer 116. The MRAM sidewall spacers 126 can also have inner upper sidewalls 128 that are separated from one another by a first distance, $d_1$, near the top electrode 104. The inner sidewalls of MRAM sidewall spacers can taper outwardly towards their bottom portions so inner lower sidewalls 130 are spaced apart from one another by a second distance, $d_2$, near the bottom electrode 102 ($d_2 > d_1$). Outer lower sidewalls 132 of the MRAM sidewall spacers 126 can be vertical or substantially vertical, and can meet outer upper sidewalls 134 of the MRAM sidewall spacers 126 at a ledge 135 or shoulder region. The outer upper sidewalls 134 of the MRAM sidewall spacers can taper inwardly, and the upper surfaces 136 of the MRAM sidewall spacers 126 can be rounded or tapered as shown, for example. A dielectric liner 138, such as a silicon dioxide liner, can conformally overlie the lower and upper outer sidewalls of the MRAM sidewall spacers and can extend over a dielectric-protection layer 140. The dielectric liner 138 can have a vertical protrusion 142 that extends upwards into a recess between outer upper sidewall 134 and upper metal layer 116. As will be appreciated, the features of FIG. 1 may provide reduced spacing between lower and upper metal layers 114, 116 due to direct contact between the top electrode 104 and upper metal layer 116, and may also be amenable to streamlined manufacturing techniques.

Figure 2:
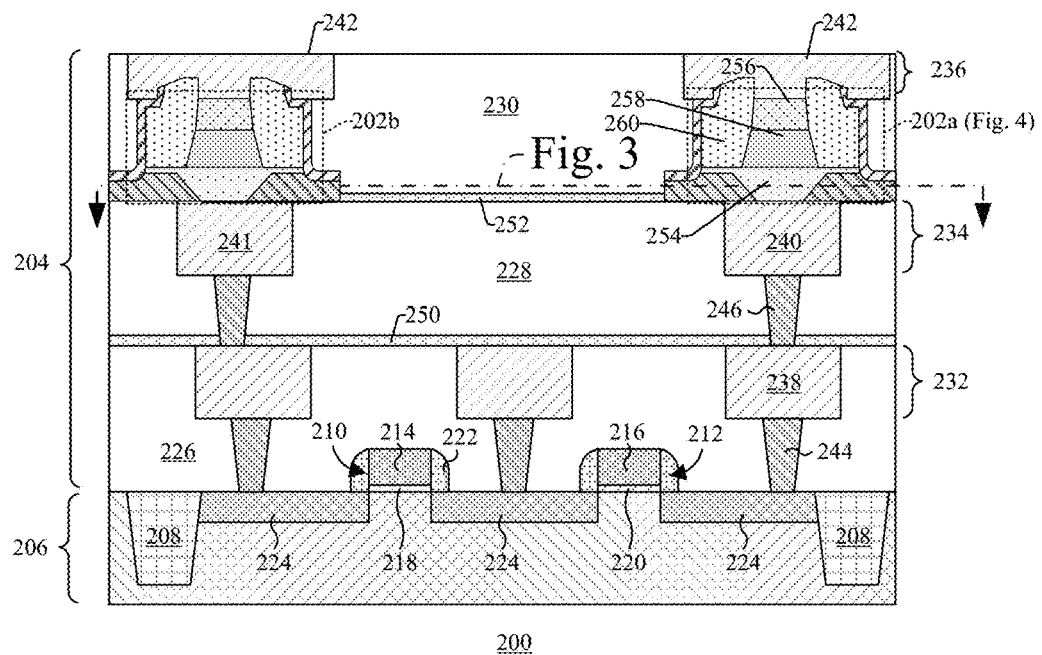
FIG. 2 illustrates a cross-sectional view of some embodiments of an integrated circuit including MRAM cells.

FIG. 2 illustrates a cross sectional view of some embodiments of an integrated circuit 200, which includes MRAM cells 202a, 202b disposed in an interconnect structure 204 of the integrated circuit 200. The integrated circuit 200 includes a substrate 206. The substrate 206 may be, for example, a bulk substrate (e.g., a bulk silicon substrate) or a silicon-on-insulator (SOI) substrate. The illustrated embodiment depicts one or more shallow trench isolation (STI) regions 208, which may include a dielectric-filled trench within the substrate 206.

Two word line transistors 210, 212 are disposed between the STI regions 208. The word line transistors 210, 212 include word line gate electrodes 214, 216, respectively; word line gate dielectrics 218, 220, respectively; word line sidewall spacers 222; and source/drain regions 224. The source/drain regions 224 are disposed within the substrate 206 between the word line gate electrodes 214, 216 and the STI regions 208, and are doped to have a first conductivity type which is opposite a second conductivity type of a channel region under the gate dielectrics 218, 220, respectively. The word line gate electrodes 214, 216 may be, for example, doped polysilicon or a metal, such as aluminum, copper, or combinations thereof. The word line gate dielectrics 218, 220 may be, for example, an oxide, such as silicon dioxide, or a high-κ dielectric material. The word line sidewall spacers 222 can be made of silicon nitride (e.g., $Si_3N_4$), for example.

The interconnect structure 204 is arranged over the substrate 206 and couples devices (e.g., transistors 210, 212) to one another. The interconnect structure 204 includes a plurality of IMD layers 226, 228, 230, and a plurality of metallization layers 232, 234, 236 which are layered over one another in alternating fashion. The IMD layers 226, 228, 230 may be made, for example, of a low κ dielectric, such as un-doped silicate glass, or an oxide, such as silicon dioxide, or an extreme low κ dielectric layer. The metallization layers 232, 234, 236 include metal lines 238, 240, 241, 242, which are formed within trenches, and which may be made of a metal, such as copper or aluminum. Contacts 244 extend from the bottom metallization layer 232 to the source/drain regions 224 and/or gate electrodes 214, 216; and vias 246 extend between the metallization layers 232, 234, 236. The contacts 244 and the vias 246 extend through dielectric-protection layers 250, 252 (which can be made of dielectric material and can act as etch stop layers during manufacturing). The dielectric-protection layers 250, 252 may be made of an extreme low-κ dielectric material, such as SiC, for example. The contacts 244 and the vias 246, 248 may be made of a metal, such as copper or tungsten, for example.

MRAM cells 202a, 202b, which are configured to store respective data states, are arranged within the interconnect structure 204 between neighboring metal layers. The MRAM cell 202a includes a bottom electrode 254 and a top electrode 256, which are made of conductive material. Between its top and bottom electrodes 254, 256, MRAM cell 202a includes an MTJ 258. MRAM cell 202a also includes MRAM sidewall spacers 260. The metal line 242 has a lowermost surface that is co-planar with and in direct electrical contact with (e.g., ohmically coupled to) a top surface of top electrode 256.

Figure 3:
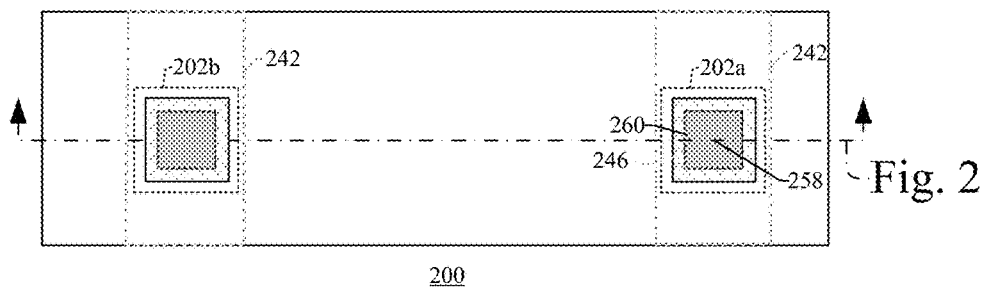
FIG. 3 illustrates a top view of some embodiments of FIG. 2's integrated circuit including MRAM cells.

FIG. 3 depicts some embodiments of a top view of FIG. 2's integrated circuit 200 as indicated in the cut-away lines shown in FIGS. 2-3. As can be seen, the MRAM cells 202a, 202b can have a square, rectangular, or circular shape when viewed from above in some embodiments. In other embodiments, however, for example due to practicalities of many etch processes, the corners of the illustrated square shape can become rounded, resulting in MRAM cells 202a, 202b having a square or rectangular shape with rounded corners, or having a circular or oval shape. The MRAM cells 202a, 202b are arranged over metal lines 240, 241, respectively, and have top electrodes 256 in direct electrical connection with the metal lines 242, respectively, without vias or contacts there between.

Figure 4:
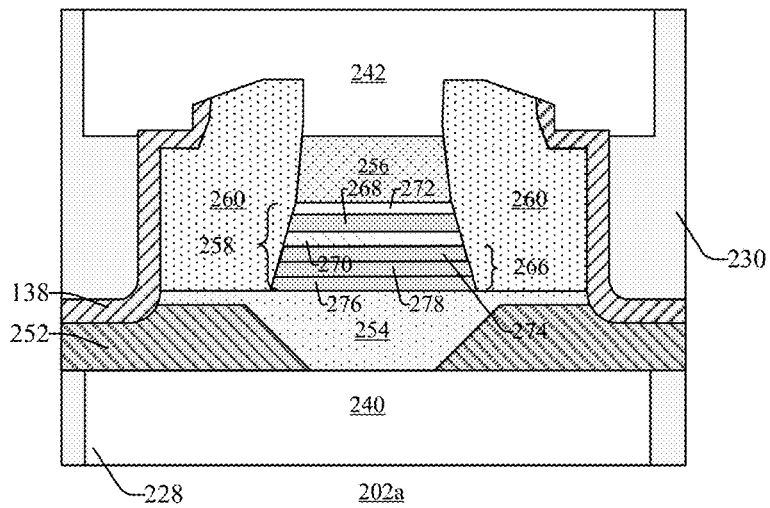
FIG. 4 illustrates an enlarged cross-sectional view an MRAM cell of FIG. 2's integrated circuit.

Referring now to FIG. 4, an enlarged cross-sectional view of FIG. 2's MRAM cell 202a is provided. As shown, the MRAM cell 202a includes bottom electrode 254 and top electrode 256 with MTJ 258 disposed between the bottom electrode 254 and top electrode 256. The bottom electrode 254 extends downwardly through in an opening in the dielectric-protection layer 252 to make electrical contact with underlying metal line 240.

In the illustrated embodiment, the MTJ 258 includes a lower ferromagnetic electrode 266 (which can have a pinned magnetic orientation) and an upper ferromagnetic electrode 268 (which can have a free magnetic orientation). A tunneling barrier layer 270 is disposed between the lower and upper ferromagnetic electrodes 266, 268; and a capping layer 272 is disposed over the upper ferromagnetic electrode 268. The lower ferromagnetic electrode 266 can be a synthetic anti-ferromagnetic (SAF) structure that includes a top pinned ferromagnetic layer 274, a bottom pinned ferromagnetic layer 276, and a metal layer 278 sandwiched between the top and bottom pinned ferromagnetic layers 274, 276.

In some embodiments, the upper ferromagnetic electrode 268 comprises Fe, Co, Ni, FeCo, CoNi, CoFeB, FeB, FePt, FePd, or the like. In some embodiments, the capping layer 272 comprises $WO_2$, NiO, MgO, $Al_2O_3$, $Ta_2O_5$, $MoO_2$, $TiO_2$, GdO, Al, Mg, Ta, Ru, or the like. In some embodiments, the tunneling barrier layer 270 provides electrical isolation between the upper ferromagnetic electrode 268 and the lower ferromagnetic electrode 266, while still allowing electrons to tunnel through the tunneling barrier layer 270 under proper conditions. The tunneling barrier layer 270 may comprise, for example, magnesium oxide (MgO), aluminum oxide (e.g., $Al_2O_3$), NiO, GdO, $Ta_2O_5$, $MoO_2$, $TiO_2$, $WO_2$, or the like.

In operation, the variable magnetic polarity of the upper (e.g., free) ferromagnetic electrode 268 is typically read by measuring the resistance of the MTJ 258. Due to the magnetic tunnel effect, the resistance of the MTJ 258 changes with the variable magnetic polarity. Further, in operation, the variable magnetic polarity is typically changed or toggled using the spin-transfer torque (STT) effect. According to the STT effect, current is passed across the MTJ 258 to induce a flow of electrons from the lower (e.g., pinned) ferromagnetic electrode 266 to the upper (e.g., free) ferromagnetic electrode 268. As electrons pass through the lower ferromagnetic electrode 266, the spins of the electrons are polarized. When the spin-polarized electrons reach the upper ferromagnetic electrode 268, the spin-polarized electrons apply a torque to the variable magnetic polarity and toggle the state of the free ferromagnetic electrode (e.g., upper electrode 268). Alternative approaches to reading or changing the variable magnetic polarity are also amenable. For example, in some alternate approaches magnetization polarities of the pinned and/or free ferromagnetic electrodes 266/268 are perpendicular to an interface between the tunneling barrier layer 270 and the pinned and/or free ferromagnetic electrode 266/268, making the MTJ 258 a perpendicular MTJ.

Advantageously, because the top electrode 256 itself is in direct electrical contact with the overlying metal line 242, the overall height of the MRAM cells 202a, 202b can be reduced relative to previous approaches. Compared to previous approaches, this reduced height makes the MRAM cells 202a, 202b more easily compatible with BEOL process flows. Thus, formation of MRAM cells 202a, 202b provides better MRAM operations with reduced manufacturing cost.

With reference to FIGS. 5 through 20, cross-sectional views of some embodiments of a semiconductor structure having an MRAM cell at various stages of manufacture are provided. Although FIGS. 5 through 20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
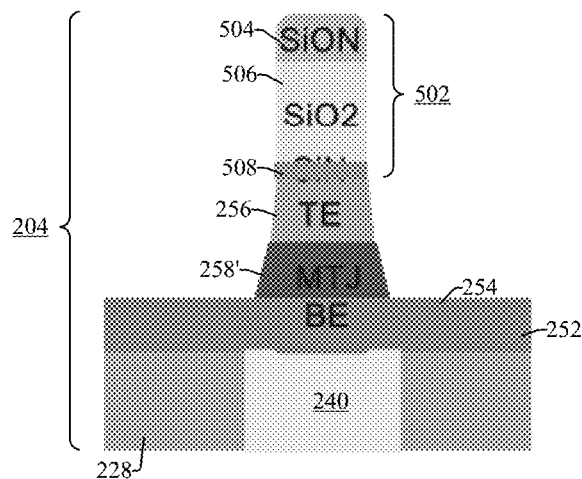

FIG. 5 illustrates a cross-sectional view of some embodiments illustrating a portion of an interconnect structure 204 disposed over a substrate (not shown in FIG. 5, but previously shown in FIG. 2). The interconnect structure 204 includes an IMD layer 228 and a metal line 240 which extends horizontally through the IMD layer 228. The IMD layer 228 can be an oxide, such as silicon dioxide, a low-κ dielectric material, or an extreme low-κ dielectric material. The metal line 240 can be made of a metal, such as aluminum, copper, or combinations thereof. In some embodiments, the substrate can be a bulk silicon substrate or a semiconductor-on-insulator (SOI) substrate (e.g., silicon on insulator substrate). The substrate can also be a binary semiconductor substrate (e.g., GaAs), a tertiary semiconductor substrate (e.g., AlGaAs), or a higher order semiconductor substrate, for example. In many instances, the substrate manifests as a semiconductor wafer, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after MRAM cells are formed, such a wafer can optionally be stacked with other wafers or die, and is then singulated into individual die which correspond to individual ICs.

A dielectric-protection layer 252 is formed over IMD layer 228 and over metal line 240. The dielectric-protection layer 252 is made of dielectric material, such as an oxide or ELK dielectric, and acts as an etch-stop layer. In some embodiments, the dielectric-protection layer 252 comprises SiC having a thickness of approximately 200 Angstroms. A bottom electrode layer 254 is formed over the dielectric-protection layer 252, and extends downwardly through an opening in the dielectric protection layer 252 to make electrical contact with an upper portion of the metal line 240. The bottom electrode layer 254 may be a conductive material, such as, for example, titanium nitride, tantalum nitride, titanium, tantalum, or a combination of one or more of the foregoing. Further, the bottom electrode layer 254 may be, for example, about 10-100 nanometers thick in some embodiments.

A magnetic tunneling junction (MTJ) stack 258' is formed over an upper surface of the bottom electrode layer 254, and a top electrode layer 256 is formed over the MTJ stack 268'. The top electrode layer 256 may be a conductive material, such as, for example, titanium nitride, tantalum nitride, titanium, tantalum, or a combination of one or more of the foregoing. Further, the top electrode layer 256 may be, for example, about 10-100 nanometers thick. A mask 502 is disposed over an upper surface of the top electrode layer 256. In some embodiments, the mask 502 includes a photoresist mask, but can also be a hardmask such as a nitride mark. In the illustrated embodiment, the mask 502 is a hardmask that includes a SiON layer 504, a $SiO_2$ layer 506, and a $Si_3N_4$ layer 508. Sidewalls of the MTJ 258 and/or top electrode 256 can be angled at an angle of other than 90-degrees as measured relative to a normal line passing through an upper surface of the bottom electrode 254.

Figure 6:
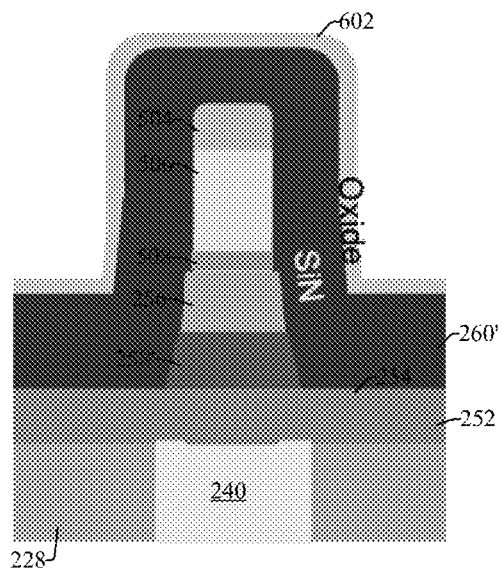

As illustrated in FIG. 6, a sidewall spacer layer 260' is formed over lateral portions of the bottom electrode 254, lining sidewalls of the MTJ 258', lining sidewalls of the top electrode 256, and extending over sidewalls and upper surface of the mask 502. In some embodiments, the sidewall spacer layer 260' may be formed by any suitable deposition technique and is typically formed conformally. Further, the sidewall spacer layer 260' may be formed of, for example, silicon nitride, silicon carbide, $Si_3N_4$, SiON, or a combination of one or more of the foregoing. Even more, the sidewall spacer layer 260' may be formed with a thickness of, for example, about 500 Angstroms. A dielectric liner 602, such as a conformal oxide, is then formed over the sidewall spacer layer 260'.

Figure 7:
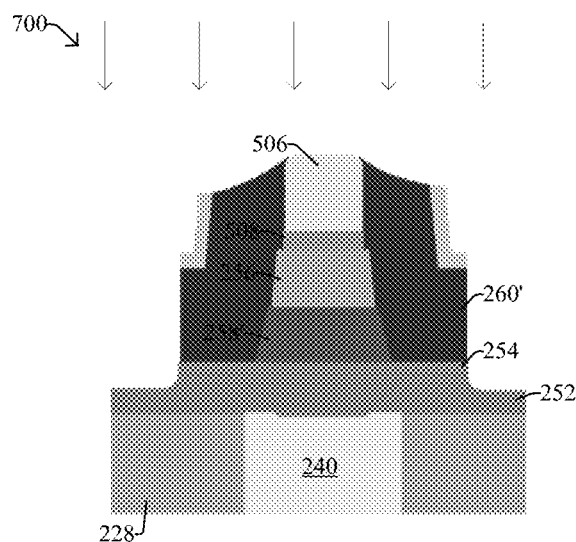

In FIG. 7, a first etch 700 has been performed into the sidewall spacer layer 260' to etch sidewall spacer layer 260' back to remove lateral stretches of the sidewall spacer layer 260', thereby forming sidewall spacers 260. In some embodiments, this first etch 700 is a unidirectional or vertical etch. The first etch 700 can also remove the SiON layer 504, and stop on the $SiO_2$ layer 506. In many cases, the first etch 700 also reduces the height of the $SiO_2$ layer 506, and thus original thickness of the $SiO_2$ layer 506 in FIG. 5 is sufficient to allow adequate margin for the first etch 700.

Figure 8:
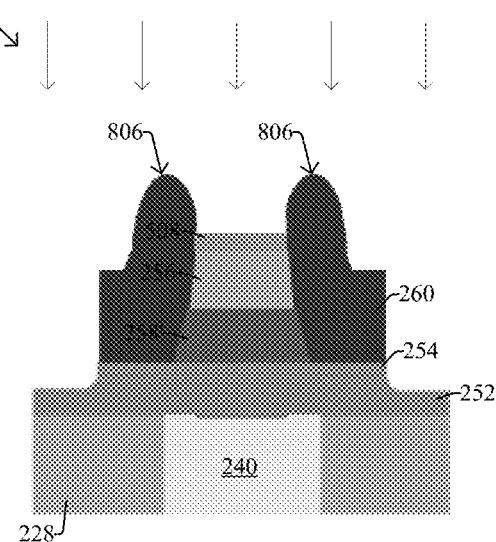

In FIG. 8, a second etch 800 is carried out to selectively remove the remaining $SiO_2$ spacer 506 from over the silicon nitride layer 508. This second etch 800 can have an etch chemistry that differs from the first etch 700, and is generally selective to the $SiO_2$ material of $SiO_2$ layer 506. Thus, the second etch 800 leaves silicon nitride spacers 260 and lower silicon nitride layer 508 substantially intact, and in some cases may "round off" the top surfaces of the silicon nitride spacers 260. Thus, an uppermost surface of each MRAM sidewall spacer can be rounded or tapered to extend downward from both sides of a peak 806 in the respective MRAM spacer.

In FIG. 9, a dielectric liner 138, such as a silicon dioxide liner, can be conformally deposited over the lateral portions of the dielectric-protection layer 252, over sidewalls and upper surfaces of the MRAM sidewall spacers 260, and over remaining silicon nitride layer 508. An IMD layer 230, such as an extreme low-k dielectric layer, is then formed over the dielectric liner 138, for example, by chemical vapor deposition (CVD), plasma vapor deposition (PVD), spin on techniques, or thermal oxidation, for example.

In FIG. 10, a chemical mechanical polishing or chemical mechanical planarization (CMP) process is carried out to planarize an upper surface of the IMD layer 230.

In FIG. 11, photolithography is carried out to pattern one or more masks (not shown), and one or more corresponding etches are carried out to form trench openings 1100 and via openings 1102. In some embodiments, these openings can be dual-damascene openings.

In FIG. 12, metal, such as aluminum or copper is used to fill the trenches and openings. Thus, in a memory region, the trench is filled with a metal line 242 which is in direct contact with an upper region of the top electrode 256, thereby providing an ohmic connection without a contact or via between the metal line 242 and top electrode 256. In another region of the integrated circuit, such as in a logic region where CMOS logic device are formed, a metal line 1200 is coupled to an underlying metal line 1204 through a via 1202. A CMP operation is then performed to planarize an upper surface of the metal lines and an upper surface of the IMD layer 230, thus resulting in the structure of FIG. 12.

FIGS. 13-16 illustrate an alternate embodiment where the mask over the top electrode includes a $SiO_2$ spacer layer 1306 and a SiON capping layer 1304. Compared to previous FIGS. 5-8, the embodiment of 13-16 omits the previously illustrated silicon nitride etch stop layer 508 over the top electrode 256. This omission may streamline processing somewhat, which can reduce costs.

Figure 13:
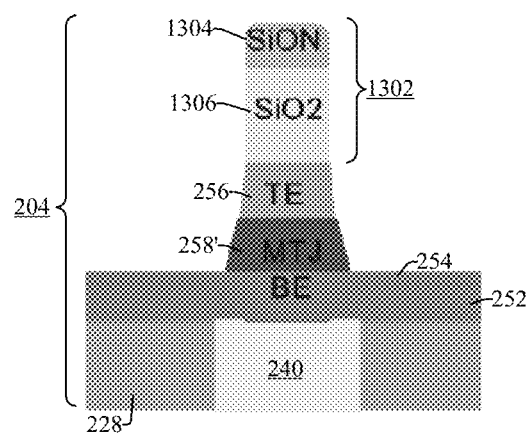

More particularly, in FIG. 13, an IMD layer 228, a metal line 240, a dielectric-protection layer 252, and a bottom electrode layer 254 are formed. A magnetic tunneling junction (MTJ) stack 258' is formed over an upper surface of the bottom electrode layer 254, a capping layer is formed over MTJ stack 258', and a top electrode layer 256 is formed over the capping layer. A mask 1302, which includes a SiON capping layer 1304 and a $SiO_2$ spacer layer 1306, is disposed over an upper surface of the top electrode layer 256.

Figure 14:
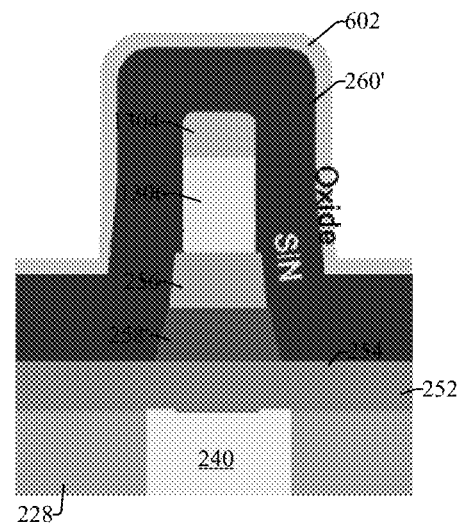

In FIG. 14, a sidewall spacer layer 260' is formed over lateral portions of the bottom electrode 254, lining sidewalls of the MTJ 258', sidewalls of the top electrode 256, and extending over sidewalls and upper surface of the mask 1302. An oxide liner 602, such as a conformal oxide, is then formed over the sidewall spacer layer 260'.

Figure 15:
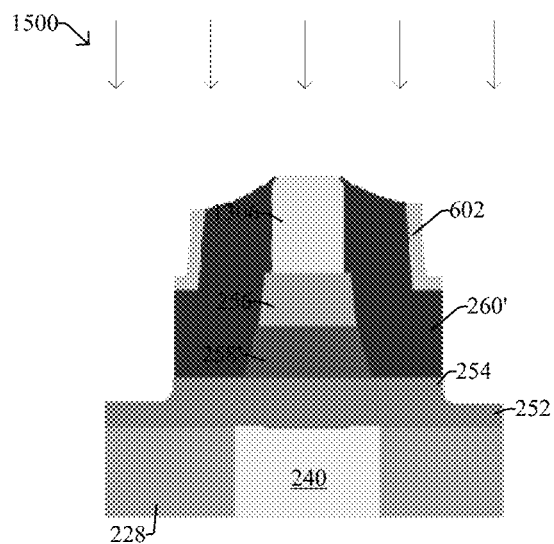

In FIG. 15, a first etch 1500 has been performed into the sidewall spacer layer 260' to etch sidewall spacer layer 260' back to remove lateral stretches of the sidewall spacer layer 260', thereby forming sidewall spacers 260. In some embodiments, this first etch 1500 is a unidirectional or vertical etch. The first etch 1500 can also remove the SiON capping layer 504, and stop on the $SiO_2$ spacer layer 1306. In many cases, the first etch 1500 also reduces the height of the $SiO_2$ spacer layer 1306, and thus original thickness of the $SiO_2$ spacer layer 1306 in FIG. 6 is sufficient to allow adequate margin for the first etch 1500.

Figure 16:
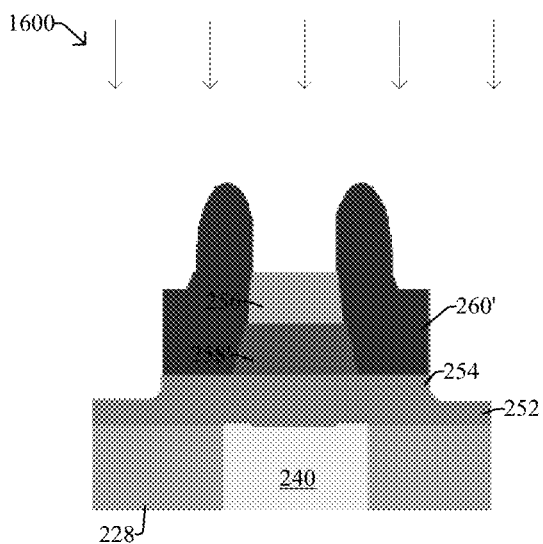
Figure 17:
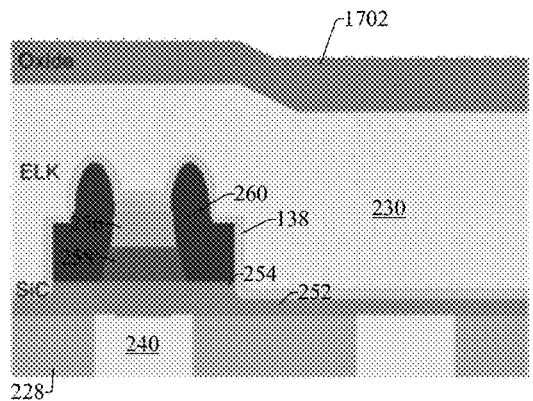

In FIG. 16, a second etch 1600 is carried out to selectively remove the remaining $SiO_2$ spacer 506 from over the top electrode 256 and from over the silicon nitride spacer 260'. This second etch 1600 can have an etch chemistry that differs from the first etch 1500, and is generally selective to the $SiO_2$ material of $SiO_2$ layer 506. Thus, the second etch 1600 leaves the silicon nitride spacers 260 and exposes an upper surface of top electrode 256, and in some cases may "round off" the top surfaces of the silicon nitride spacers 260. After FIG. 16, processes similar to FIG. 9-FIG. 12 may be carried out, albeit with the dielectric liner 138 of FIG. 9 in direct contact with upper surface of the top electrode 256.

Figure 18:
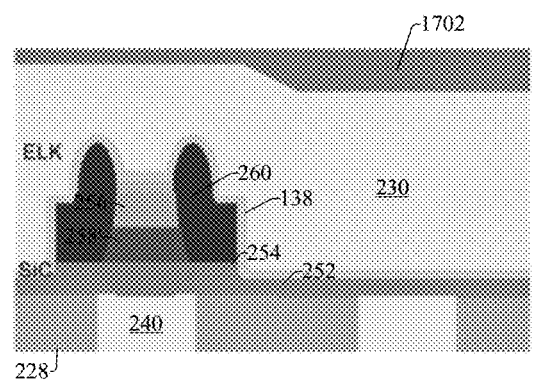
Figure 19:
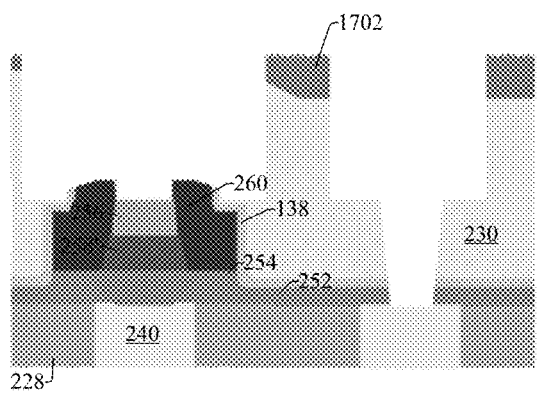
Figure 20:
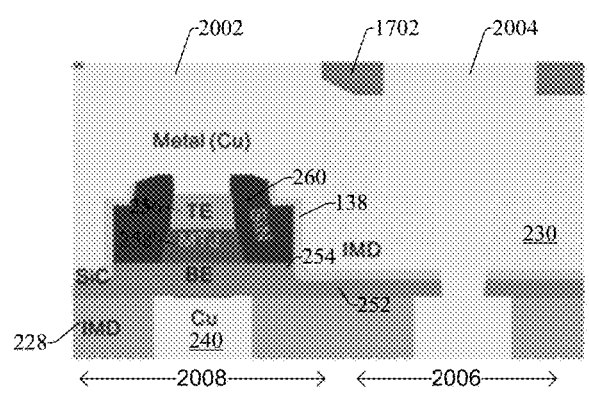

FIGS. 17-20 show another alternative embodiment. Following from previously described FIG. 9, FIG. 17 forms an oxide layer 1702 over the structure of previous FIG. 9. In FIG. 18, a CMP operation is carried out to planarize the oxide layer 1702; and in FIG. 19, trench openings and via openings are formed. In FIG. 20, metal is deposited to fill the trench openings and via openings, thereby forming metal lines 2002, 2004. The oxide layer 1702 is thicker over the logic region 2006 and is thinner over the memory region 2008. Thus, the final structure in FIG. 20 exhibits both low-k dielectric 230 and oxide 1702 at various heights on sidewalls of the metal lines.

Figure 21:
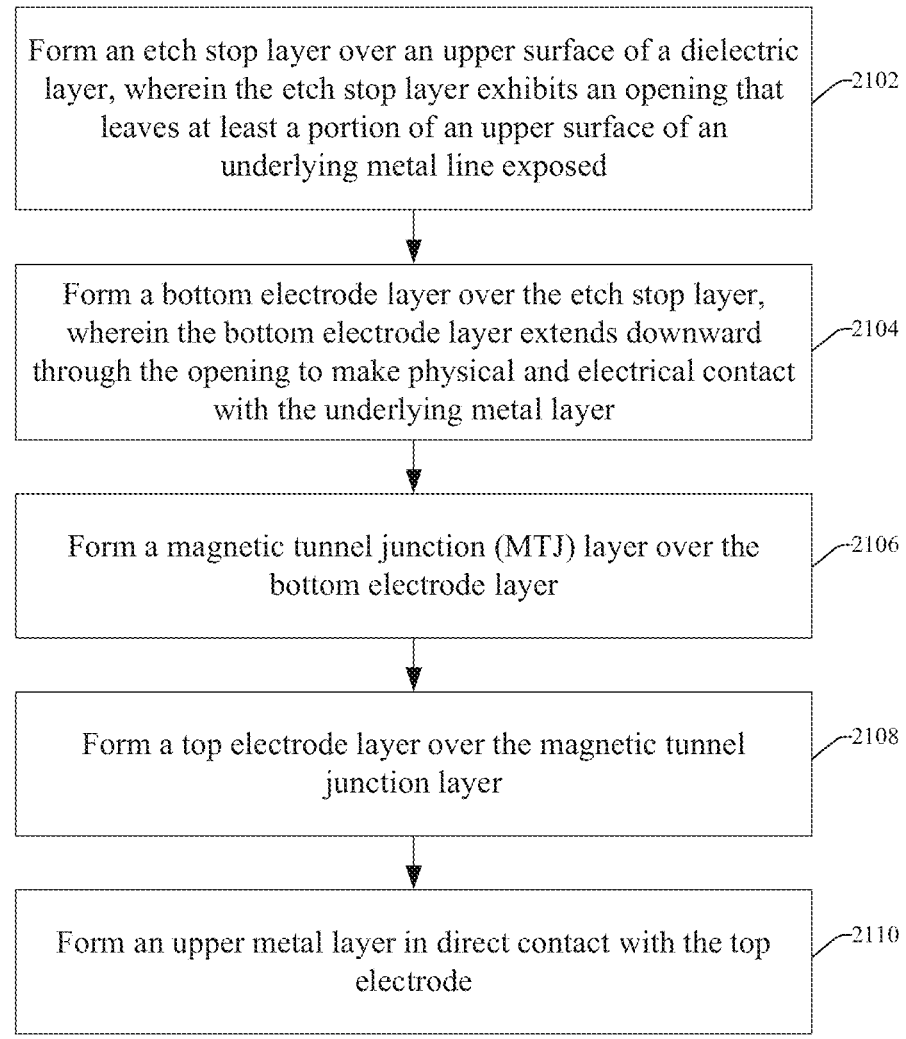
FIG. 21 illustrates a methodology in flowchart format that illustrates some embodiments of the present concept.

FIG. 21 illustrates a methodology 2100 of forming an MRAM cell in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 2102 through 2108 can correspond, for example, to the structure previously illustrated in FIG. 5 in some embodiments. At 2102, an etch stop layer is formed over an upper surface of a dielectric layer. The etch stop layer exhibits an opening that leaves at least a portion of an upper surface of an underlying metal line exposed. At 2104, a bottom electrode layer is formed over the etch stop layer. The bottom electrode layer extends downward through the opening to make physical and electrical contact with the underlying metal layer. At 2106, a magnetic tunnel junction (MTJ) layer is formed over the bottom electrode layer. At 2108, a top electrode layer is formed over the magnetic tunnel junction layer. At 2110, which can correspond to example to previously illustrated FIG. 12, an upper metal layer is formed to be in direct physical and electrical contact with the top electrode.

Some embodiments relate to an integrated circuit including a magnetoresistive random-access memory (MRAM) cell. The integrated circuit includes a semiconductor substrate and an interconnect structure disposed over the semiconductor substrate. The interconnect structure includes a plurality of dielectric layers and a plurality of metal layers that are stacked over one another in alternating fashion. The plurality of metal layers include a lower metal layer and an upper metal layer disposed over the lower metal layer. A bottom electrode is disposed over and in electrical contact with the lower metal layer. A magnetic tunneling junction (MTJ) is disposed over an upper surface of bottom electrode. A top electrode is disposed over an upper surface of the MTJ and is in direct electrical contact with a lower surface of the upper metal layer.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a semiconductor substrate;
an interconnect structure disposed over the semiconductor substrate, the interconnect structure including a plurality of metal layers stacked over one another within a dielectric structure, wherein the plurality of metal layers include a lower metal layer and an upper metal layer disposed over the lower metal layer;
a bottom electrode disposed over and in electrical contact with the lower metal layer;
a magnetic tunneling junction (MTJ) disposed over an upper surface of bottom electrode;
a top electrode disposed over an upper surface of the MTJ and being in direct electrical contact with a lower surface of the upper metal layer; and
a sidewall spacer structure disposed along an outer sidewall of the top electrode and along an outer sidewall of the MTJ, wherein the sidewall spacer structure has an upper portion that extends upwardly beyond an upper surface of the top electrode and into a lower surface of the upper metal layer, wherein the sidewall spacer structure has outer sidewalls that include a vertical or substantially vertical lower outer sidewall portion and an upper outer sidewall portion, wherein the lower outer sidewall portion meets at an upwardly facing ledge at an outer corner and the upwardly facing ledge meets the upper outer sidewall portion at an inner corner, the upwardly facing ledge being at a height that is higher than an upper surface of the bottom electrode.

2. The integrated circuit of claim 1, further comprising:
wherein the sidewall spacer structure has inner upper sidewalls that are separated by a first distance near the top electrode, and has inner lower sidewalls that are spaced apart by a second distance, wherein the second distance is greater than the first distance.

3. The integrated circuit of claim 2, wherein an uppermost surface of the sidewall spacer structure is rounded or tapered.

4. The integrated circuit of claim 1, wherein the upwardly facing ledge is located at a first height, as measured from an upper surface of the semiconductor substrate, and the top electrode has an uppermost surface that is located at a second height, as measured from the upper surface of the semiconductor substrate, the first height being less than the second height.

5. The integrated circuit of claim 1, wherein the upwardly facing ledge is located at a first height, as measured from an upper surface of the semiconductor substrate, and the top electrode has a lowermost surface that is located at a second height, as measured from the upper surface of the semiconductor substrate, the first height being greater than the second height.

6. The integrated circuit of claim 1, further comprising:
a dielectric liner that conformally overlies outer sidewalls of the sidewall spacer structure.

7. The integrated circuit of claim 6, wherein an uppermost surface of the dielectric liner terminates along a sidewall of the sidewall spacer structure.

8. A device disposed on a semiconductor substrate, the device including:
a bottom electrode disposed over the semiconductor substrate;
a dielectric layer disposed over the bottom electrode;
a top electrode disposed over an upper surface of the dielectric layer;
a sidewall spacer structure along an outer sidewall of the top electrode and along an outer sidewall of the dielectric layer, wherein the sidewall spacer structure has a lower portion alongside the MTJ and an upper portion that extends upwardly from the lower portion to beyond an upper surface of the top electrode, and wherein the lower portion is wider than the upper portion to establish a ledge that connects a lower outer sidewall and an upper outer sidewall of the sidewall spacer structure;
a metal line disposed over the top electrode, wherein the upper portion of the sidewall spacer structure extends into a recess in a lower surface of the metal line; and
a dielectric liner overlying the lower outer sidewall, the ledge, and the upper outer sidewall of the sidewall spacer structure to establish an inner corner and an outer corner in an outer sidewall of the dielectric liner, and terminating at an uppermost dielectric liner surface, the uppermost dielectric liner surface residing below an uppermost surface of the sidewall spacer structure such that the dielectric liner does not cover the uppermost surface of the sidewall spacer structure.

9. The device of claim 8, wherein the sidewall spacer structure has a lowermost surface that rests on an upper surface of the bottom electrode.

10. The device of claim 8, wherein the sidewall spacer structure has an inner sidewall and an outer sidewall, with the inner sidewall of the sidewall spacer structure is nearer the top electrode than the outer sidewall of the sidewall spacer structure, the inner sidewall of the sidewall spacer structure having upper portions spaced apart by a first distance and lower portions spaced apart by a second distance, the second distance being greater than the first distance.

11. The device of claim 10, wherein the lower portions of the inner sidewall are angled at an angle of other than 90-degrees as measured relative to a normal line passing through an upper surface of the bottom electrode.

12. The device of claim 11, wherein an uppermost surface of the sidewall spacer structure includes a peak with rounded or tapered surfaces extending downwardly in opposite directions from the peak.

13. The device of claim 8, wherein outer lower sidewalls of the sidewall spacer structure are vertical or substantially vertical, and meet outer upper sidewalls of the sidewall spacer structure at a ledge or shoulder region.

14. The device of claim 13, wherein the ledge or shoulder region is level or flat and is located at a first height, as measured from an upper surface of the semiconductor substrate, and the top electrode has an uppermost surface that is located at a second height, as measured from the upper surface of the semiconductor substrate, the first height being less than the second height.

15. The device of claim 13, wherein the ledge or shoulder region is upwardly facing and is located at a first height, as measured from an upper surface of the semiconductor substrate, and the bottom electrode has an uppermost surface that is located at a second height, as measured from the upper surface of the semiconductor substrate, the first height being greater than the second height.

16. A device disposed on a semiconductor substrate, the device comprising:
- a bottom electrode;
- a dielectric layer disposed over the bottom electrode;
- a top electrode disposed over an upper surface of the dielectric layer;
- a sidewall spacer structure along outer sidewalls of the top electrode and dielectric layer, wherein the sidewall spacer structure has an upper portion that extends upwardly beyond the upper surface of the top electrode; and
- an upper metal line disposed over the top electrode and comprising a single layer, the single layer comprising a lower surface comprising a central lower surface region in direct physical and electrical contact with the upper surface of the top electrode and a peripheral lower surface region extending laterally past an outer edge of the sidewall spacer structure, the central lower surface region being level with the peripheral lower surface region.

17. The device of claim 16, wherein the sidewall spacer structure has lowermost surfaces that rest on an upper surface of the bottom electrode.

18. The device of claim 16, wherein the sidewall spacer structure has inner sidewalls and outer sidewalls, with the inner sidewalls being nearer the top electrode than the outer sidewalls, the inner sidewalls having upper portions that spaced apart by a first distance and lower portions that are spaced apart by a second distance, the second distance being greater than the first distance.

19. The device of claim 18, wherein the lower portions of the inner sidewalls are angled at an angle of other than 90-degrees as measured relative to a normal line passing through an upper surface of the bottom electrode.

20. The device of claim 16, wherein an uppermost surface of the sidewall spacer structure includes a peak with rounded or tapered surfaces extending downwardly in opposite directions from the peak.

* * * * *